United States Patent [19]
Roberts

[11] Patent Number: 6,092,282
[45] Date of Patent: Jul. 25, 2000

[54] METHOD OF MANUFACTURING PRINTED CIRCUITS

[75] Inventor: Joseph A. Roberts, Grafton, N.H.

[73] Assignee: Research Organization for Circuit Knowledge, Hudson, N.H.

[21] Appl. No.: 09/332,542

[22] Filed: Jun. 14, 1999

Related U.S. Application Data

[60] Division of application No. 08/982,983, Dec. 2, 1997, Pat. No. 5,950,305, which is a continuation-in-part of application No. 08/622,243, Mar. 25, 1996, Pat. No. 5,819,579, which is a division of application No. 08/358,855, Dec. 19, 1994, Pat. No. 5,528,001, which is a continuation-in-part of application No. 08/016,002, Feb. 10, 1993, Pat. No. 5,477,612, which is a continuation-in-part of application No. 07/837,357, Feb. 14, 1992, Pat. No. 5,343,616.

[51] Int. Cl.[7] ...................................................... H01K 3/22
[52] U.S. Cl. .................................. 29/848; 29/830; 29/846
[58] Field of Search .............................. 29/830, 831, 825, 29/DIG. 37, 848, 846

[56] References Cited

U.S. PATENT DOCUMENTS 5,184,111 2/1993 Pichl .................................. 29/DIG. 37

FOREIGN PATENT DOCUMENTS

1951778 8/1971 Germany ................................. 29/830
1019682 5/1983 U.S.S.R. ................................... 29/830

*Primary Examiner*—Carl J. Arbes
*Attorney, Agent, or Firm*—Davis and Bujold

[57] ABSTRACT

Methods of facilitating commercial production of supported conductive networks without the use of hazardous chemicals including using heat flowable adhesive in the formation of the networks, providing contact pads exposed through a dielectric substrate which supports a conductive network, using the thickness of a conductor supporting dielectric layer to space the conductors and providing conductor and waste material cross-sections trapezoidal in shape in a non-planar pattern during manufacture of the networks.

7 Claims, 6 Drawing Sheets

METHOD OF MANUFACTURING PRINTED CIRCUITS

This application is a Divisional Application of U.S. patent application Ser. No. 09/982,983 filed Dec. 2, 1997 which is a Continuation-in-Part of U.S. patent application Ser. No. 08/622,243 filed Mar. 25, 1996 which is a Divisional Application of U.S. application Ser. No. 08/358,855 filed Dec. 19, 1994 (now U.S. Pat. No. 5,528,001) which in turn is a Continuation-in-Part of U.S. patent application Ser. No. 08/016,002 filed Feb. 10, 1993 (now U.S. Pat. No. 5,477,612) which is in turn a Continuation-in-Part of U.S. application Ser. No. 07/837,357 filed Feb. 14, 1992 (now U.S. Pat. No. 5,343,616).

FIELD OF THE INVENTION

This invention generally relates to an environmentally desirable method for producing high density electrically conductive networks supported by a layer of flexible or rigid dielectric, which have densely packed conductive paths, the supported networks themselves and associated apparatus.

DEFINITIONS

The term "Conductor" as used herein shall be construed to be an electrical conductor.

The term "Reference plane" as used throughout the specification and claims is intended to include planar, cylindrical (i.e. a roller) and any other single curvature surface appropriate to a given manufacturing situation as well as the preferred planar surface.

The term "die" as used herein includes planar, cylindrical, or curved dies that cooperate with a planar, cylindrical, or single curved support surface arranged to provide support at the reference plane.

The term "Dynamic Pressure Cushion" is used herein to describe the characteristics of an adhesive, dielectric and/or compliant carrier used to support a conductive foil during formation of a conductive network of the invention. The dynamic pressure cushion has a viscosity during forming which is fluid enough to allow the carrier to flow out from under depressed circuit forming portions of the foil and to fill all voids under the foil while being viscous enough to support and even raise the waste material to a prescribed level for waste removal.

The term "Control Grid" as used herein refers to features of the die arranged, positioned and dimensioned to control movement of the carrier during formation of a conductive network of the invention.

The term "parallel" as used herein shall be construed to include "coincident with", e.g. a plane coincident with a surface of a lamina.

The term "thin" as used herein shall be construed to define a layer of metallic or dielectric material having a thickness of less than 0.005 inches (0.13 mm), preferably in the range of 0.0007 inches (0.02 mm) to 0.0042 inches (0.11 mm).

BACKGROUND OF THE INVENTION

One class of supported networks to which the present invention relates is frequently characterized by the term "printed circuits." (The term "circuit" will be used to signify one or more conductors, combinations thereof, electrical, including magnetic components per se, or such components and associated conductors.) The term "printed circuits" originates from the technique of printing the electrical assembly, which may comprise, for example, a network of conductors, the stator of a switch or the rotor of a motor, on an insulated base by means of the selective deposition of a conductive material thereon in conformity with the desired circuit configuration. Electrolytic, electroless and mechanical (spraying, sputtering, etc.) techniques have been employed to provide this printing operation.

In addition to the above, the term "printed circuits" has been applied to components, assemblies or circuits formed by techniques of selectively removing sections from an insulation-backed conductive blank, by selectively etching the non-conductive regions, the conductive components being protected by an etch resist printed on the blank in conformity with the desired circuit configuration.

In addition to the production of printed circuits, the methods of the invention are applicable to the production of other electrical components heretofore produced by solely mechanical means such as by stamping. Burdening all of the foregoing techniques are certain limitations. Many of the techniques are not sufficiently accurate, require expensive machinery and are frequently impractical where a design is to be mounted on or laminated to an insulated base. The usual printed circuit techniques are environmentally undesirable and incompatible with the requirements for mass production, needing elaborate environmental control, having a susceptibility to latent defects in the resultant product (and thus requiring rigorous quality control), and being relatively expensive. Frequently it is necessary to provide temporary supports during various production stages. Moreover, the strength of many printed circuits leaves much to be desired. Generally, only relatively thin, flat structures can be produced. This, together with high resistivity and tendencies to delaminate and deteriorate under certain conditions have limited the applicability of these circuits. In spite of this, the trend is toward wider adoption of printed circuit techniques, this being due in part to the increasing emphasis on weight reduction and miniaturization and to the prohibitive costs in time, labor and materials of conventional circuit wiring and cabling procedures.

Developments in the electronics industry require the use of more densely packed electrical modules and circuits, each requiring multiple interconnections to one another. However, there is a practical limit to the density that can be achieved using conventional conductive networks. In a typical present day application, a floppy disk drive may require a connection to a recording head whose conductors are only on the order of 0.2 mm (0.008 inches) on center and associated jumper conductors must have a similar spacing. Further, recent liquid crystal displays have conductors which are even more closely packed, for example, 0.1 mm (0.004 inches) on center, with similar requirements for interconnection conductors. In addition, there is growing use of ceramic PC boards to accommodate multiple IC chip arrays which also require high density connectors and custom interconnect cables for purposes of terminating those components. In the near future printed circuits with conductors as narrow as 0.0015 inches (0.04 mm) or less spaced apart by as little as 0.0015 inches (0.04 mm) or less will be specified by the electronics industry.

As a direct result of the growth in the circuit board industry, there has been a parallel increase in the volume of environmentally-hazardous chemicals generated by the conventional etching and deposition processes. For example, it is not uncommon for one circuit board fabrication facility to generate 4,000 liters (1,000 U.S. gallons) per day of photo resist stripper and 4,800 liters (1,200 U.S. gallons) per week of developer solution. These toxic wastes must be transported off-site for proper disposal at hazardous waste management sites. Thus, there is an urgent need for a practical non-chemical method for the manufacture of conductive networks, particularly high density conductive networks.

It is known to form a planar electrically conductive sheet into a non-planar pattern in a purely mechanical process, i.e. no etching is involved, by forming a conductive foil to define a circuit pattern spaced by waste material, the foil being attached to a dielectric material before, during or after forming, and surface machining the waste material off. However, the known methods of mechanically forming circuits have never been able to attain commercial acceptance due to technical problems and are unable to produce the high density networks required by modern technology.

Current art teaches various methods of forming a planar electrically conductive sheet into a non-planar pattern. U.S. Pat. No. 2,716,268 teaches how to build a printed circuit board by embossing a conductive foil (circuit pattern) into a plastic sheet and surface grinding off the waste material. This and other patent applications, which are now in public domain, must be viewed as abstract concepts that were never able to attain commercial acceptance due to their many technical problems.

One significant technical problem, ignored by the prior art, is what happens to the adhesive or dielectric when forming a planar electrically conductive sheet into a non-planar pattern. The known prior art suggests that the adhesive and/or dielectric is compressed into a smaller space. This is both dimensionally impractical and extremely unstable, as it builds compression stresses into the structure. As the waste material is machined off, the compressed material expands changing the location of conductors in the X, Y and Z planes thereby altering the desired circuit pattern, perhaps even causing portions of the desired circuits to be removed. This condition virtually eliminates any possibility of accomplishing the precision machining required to create fine line conductors in a high density network circuit. All known prior art ignores one or more of the following fundamental technical problems that have prevented these known processes from achieving any degree of commercial success. Current art does not teach us how to:

1. Form a sheet of conductive material as thin as or thinner than 0.0007 inches (0.02 mm) thick sheet of conductive material into a non-planar pattern and protect its formed shape as it is processed through lamination and machining operations without damaging the formed structure;
2. Form a laminate, consisting of a conductive material attached to a dielectric, while maintaining the flatness and precise location of conductors within the structure as is necessary to successfully remove all waste and maintain the desired conductor thickness;
3. Form a laminate, consisting of a conductive material attached to a dielectric, while maintaining a substantially flat and stable reference plane necessary for precise location of conductors within the structure and for precise removal of waste material.
4. Eliminate the distortion, resulting from compression stresses, that occurs as waste material flows away from the embossed pattern. NOTE: Material must be undistorted for the accurate grinding of waste material off;
5. Stabilize, support and entrap a thin conductor (e.g. 0.0007 inches (0.018 mm) thick and 0.001 inches (0.025 mm) wide, to prevent its movement or delamination, as the waste material is mechanically ground off;
6. Emboss a conductive foil into an adhesive layer less than half its thickness. (e.g. Embossing a 0.0014 inches (0.036 mm) thick conductive foil (circuit pattern) into an adhesive layer less than 0.0007 inches (0.018 mm) thick and surface machining off the waste material off leaving a 0.0014 inches (0.036 mm) thick conductor;
7. Create a finished circuit with a variety of conductor thicknesses designed to accommodate specific electrical and/or mechanical requirements;
8. Eliminate the technical and cost limitations related to preparing and applying a dielectric overlay;
9. Attach a temporary carrier that is generally a "compliant material" and as such can be conditioned (heat and/or pressure) to assists in first forming a structure (either a laminate consisting of a conductive material attached to a dielectric or conductive material) and once formed, maintaining that structure's critical dimensions (flatness of the temporary carrier necessary to establish and maintain a true machining reference plane based on the location of the conductors and the desired conductor thickness) necessary to successfully remove all waste material and maintain the desired conductor thickness;
10. Create contact pads exposed through a supporting dielectric layer in such high density networks;
11. Use displaced adhesive to position the conductors in spaced relationship to each other; and
12. Provide waste material removal (cut) line fixed relative to a reference surface.

Due to the technical problems experienced by the prior art techniques they are unable to mass produce high density, multiple fine line circuit networks. The known techniques are limited to relatively thick, low density circuits and are therefore unsuited to meet today's demand for high density, fine line conductive circuits, for example multiple conductors spaced at 0.004 inches (0.1 mm) on center.

It is a primary object of the present invention to provide a method of manufacturing a relatively inexpensive, high-quality, densely packed, supported conductive network for use in fabricating rigid or flexible circuit boards, without the use or generation of environmentally hazardous chemicals.

Other objects of the invention are to overcome shortcomings of the prior art as set forth in the numbered sub-paragraphs above and, in particular, to provide a method of forming a planar conductive material into a non-planar pattern either independently or when attached to a dielectric, in which:

a) the formed conductors may be positioned in spaced relationship to each other and to a fixed reference plane, defined by, for example, the dielectric, to ensure proper waste removal and conductor shaping, thickness, width and configuration);

b) a conditioned adhesive and/or dielectric is used to receive, capture and support a formed conductor pattern and to eliminate half of a die set (either the male, when extruding a conductive material or a female when forming a foil/dielectric laminate);

c) each individual conductor is supported on at least three of its four sides, through the lamination and machining operations to ensure that the conductors are not separated from the dielectric;

d) a flexible conductive network forms conductive paths which are profiled to self-align with corresponding conductors of other conductive networks;

e) a thin sheet of conductive material is formed into a non-planar pattern and processed without damaging the formed structure;

f) the flatness and precision, of a laminate, necessary to remove waste and maintain the desired conductor thickness is accurately maintained;

g) distortion problems that occur during the forming operations in the prior art are eliminated;

h) a method able to stabilize, support and entrap a thin conductor to prevent delamination as the waste material is ground off is provided;

i) a conductive foil is embossed into an adhesive layer less than half it's thickness.

SUMMARY OF THE INVENTION

Simply stated the method of the present invention relies on three basic principles for creating a conductive circuit pattern, namely:

1) Forming, a planar conductive material into a non-planar pattern defining a desired circuit pattern;

2) Providing an adhesive and/or dielectric having a characteristics suitable to receive, capture and support a formed conductor pattern and controlling its flow during the forming operation. Use of an adhesive and/or dielectric in a state having the correct viscosity allows the elimination of half of a die set (either the male half when extruding a conductive material or the female half when forming a laminate); and 3) Supporting each individual conductor, on at least three of its four sides, through the lamination and grinding operations. This support ensures that the conductors do not separate from the dielectric.

According to the invention there is provided a method of forming a conductive metallic lamina, supported on a substrate by a heat flowable dielectric adhesive, into a non-planar pattern defining electrically conductive paths depressed to at least a first level with raised areas of unwanted waste conductive material at a second level, comprising: i) heating the adhesive to become fluid substantially only under portions of the lamina to be depressed to said at least a first level; ii) displacing the adhesive under said portions by depressing the lamina in said portions to said at least a first level while leaving areas of unwanted waste conductive material supported at said second level by said adhesive; and iii) cooling the adhesive to solidify the adhesive.

Preferably the method of forming a conductive metallic lamina, supported on a substrate by a heat flowable dielectric adhesive, into a non-planar pattern defining electrically conductive paths depressed to at least a first level with raised areas of unwanted waste conductive material at a second level, comprises: a) providing a template having a forming surface defining conductive path forming features forforming the conductive lamina into said conductive paths, the forming features being spaced by recesses in the forming surface in the areas of unwanted waste conductive material; b) supporting the substrate; c) heating at least the path forming features of the forming surface to a temperature sufficient to cause the adhesive to become flowable when the path forming features are in contact with the conductive metallic lamina; d) bringing the path forming features into contact with the conductive metallic lamina with the recesses spaced from the conductive metallic lamina for a sufficient time to cause the adhesive under the path forming features to become fluid and insufficient for the adhesive adjacent the substrate to become fluid and insufficient for a substantial portion of the adhesive under the areas of unwanted waste conductive material to become fluid; e) moving the path forming features against the conductive metallic lamina to displace the fluid adhesive from under the path forming features to areas under the unwanted waste material thereby to form the non-planar pattern with the conductive paths depressed to said at least a first level and the unwanted waste conductive material supported by the adhesive, at said second level; and f) removing the template from the formed lamina.

The method may also provide flow control grid features spaced from the electrically conductive paths and disposed at the first level, with the forming surface including control grid forming features for forming the conductive lamina into said flow control grid features, steps c), d) and e) above also apply to the formation of the flow control grid features and in step g) above the removal of the unwanted waste material also forms conductive control grid features electrically isolated from the conductive network by adhesive and supported by the solidified dielectric adhesive and the substrate.

The non-planar pattern may include electrically conductive contact areas integral with the electrically conductive paths depressed to a third level a greater distance from the second level than the first level and the step of depressing the lamina then includes depressing said portions to said first and third levels; and comprising the step of removing the substrate and solidified adhesive adjacent thereto to expose the contact areas.

Also according to the invention there is provided a method of forming a conductive metallic lamina, into a non-planar pattern defining spaced electrically conductive paths at a first level and unwanted waste conductive material at second and third levels one on either side of the first level, the lamina comprising first and second electrically conductive laminae fast with and spaced by a dielectric substrate, comprising: a) forming the lamina into the non-planar pattern with the electrically conductive paths lying in a plane defined by the first level and alternately composed of the first and second electrically conductive laminae; b) machining to remove the unwanted waste conductive material at the second level to expose the electrically conductive paths of both laminae spaced apart by the dielectric substrate; c) applying a layer of dielectric material to cover and support the thereby exposed electrically conductive paths and dielectric substrate therebetween; and d) machining to remove the unwanted waste conductive material at the third level to again expose the electrically conductive paths of both laminae spaced apart by the dielectric substrate and supported by the layer of dielectric material.

Also according to the invention, there is provided a method of forming an electrically conductive foil into a non-planar pattern defining electrically conductive paths at least at a first level and unwanted waste conductive material at a second level, wherein the electrically conductive paths and unwanted waste conductive material are trapezoidal in cross-section comprising providing a die set having mating male and female die halves shaped to define the trapezoidal cross-section by trapezoidal features of forming surfaces of the die halves and using the die set to forming the non-planar pattern.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 2:
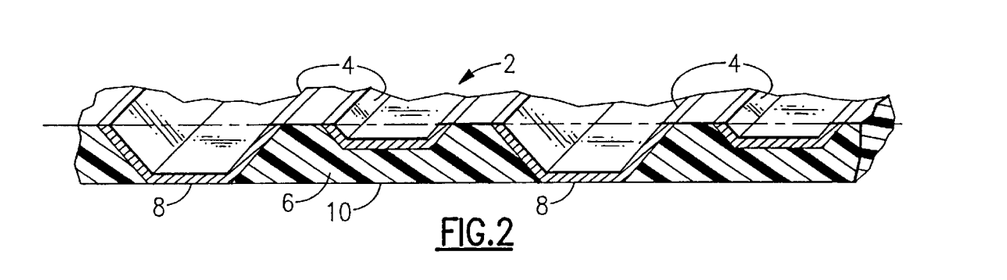
Figure 3:
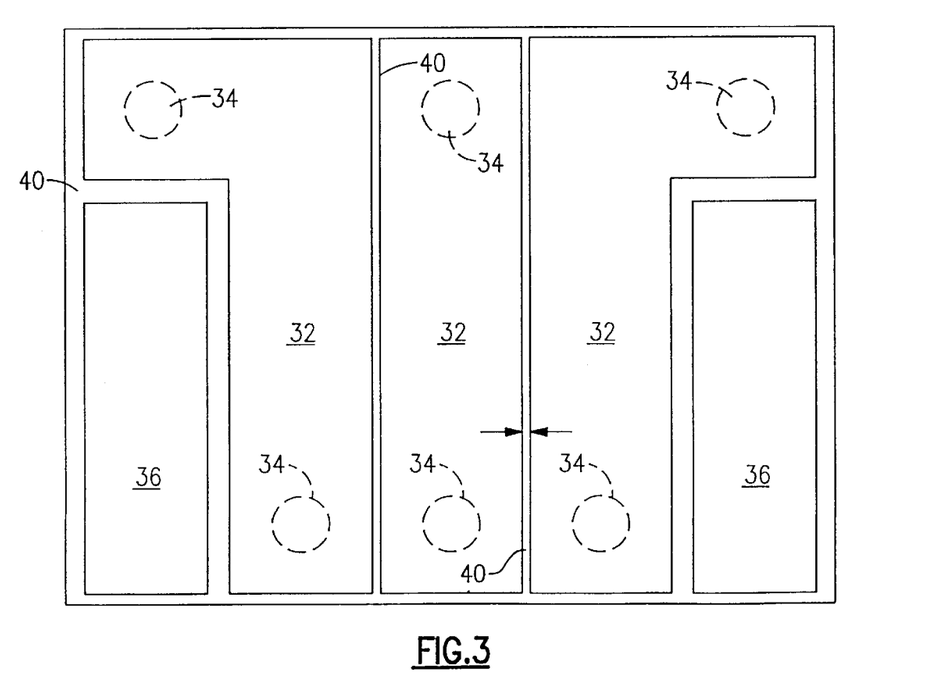
FIG. 3 is a diagrammatic representation of a circuit pattern having wide conductors spaced by narrow areas of dielectric as produced by a second embodiment of the present invention.

Referring first to FIG. 2 a flexible supported conductive network (FSCN) 2 of the present invention comprises a plurality of conductors 4 supported by a flexible dielectric 6. Some of the conductors have contact areas 8 exposed through the face 10 of the dielectric. These contact areas 8 are an optional feature and may exist in only a limited area of the associated conductors 4. Although shown as parallel for simplicity, the conductors 4 may define any circuit pattern required of the circuit. Typically, the conductors 4 are copper or a copper alloy and may be selectively plated or coated with gold or other desired metal (e.g. platinum or silver) or a metal alloy (e.g. solder). Also typically the dielectric 6 may be a polyimide (e.g. Kapton) fast with the conductors 4. Although here described with reference to a flexible dielectric, the dielectric could be rigid in the finished printed circuit in many of the embodiments hereinafter described as will be apparent to a man skilled in the art.

Figure 1:
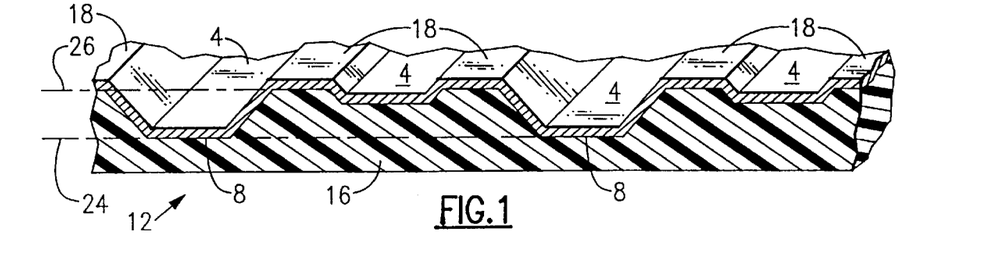
FIGS. 1 and 2 diagrammatically illustrate the method of a first embodiment to the present invention in which conductors are formed at different depths to facilitate the production of contact areas extending through a dielectric layer.

A method of making a flexible supported conductive network (FSCN) 2 with exposed contact pads will now be described with reference to FIGS. 1 and 2. A laminate 12 comprising a copper alloy foil 14 fast, on one face, with a polyimide dielectric material 16. The foil is formed by a coining or stamping process and extends into the dielectric material to form a non-planar pattern comprising areas of waste material 18 disposed above and separating a desired pattern of conductors 4 which are disposed at two levels, below the waste material 18, comprising lower level 20 defining contact areas 8 and a level 22 intermediate the lower level and the waste material 18.

The laminate is then mechanically machined to machine line 24 to remove dielectric material 16 to expose the contact areas 8 though the dielectric material 16 thus leaving only the dielectric material 6 as shown in FIG. 2. A desired surface finish (e.g. gold plating) may then be applied to the contact areas 8.

Next the waste material 18 is removed by machining to machine line 26 using mechanical machining, for example, fly cutting using a diamond toothed fly cutter, wire EDM, etc.

An alternative to this process involves preforming the copper foil and subsequently adhering the dielectric layer to the formed foil and then proceeding as above. In this case the dielectric may itself be an adhesive which is cured prior to machining or may be a sheet of dielectric which is attached to the foil by a dielectric adhesive which is then cured prior to machining.

A method of constructing a circuit pattern with closely spaced conductors of any desired width will now be described. Referring firstly to FIGS. 3 to 8, a FSCN 30 comprises relatively wide conductors 32 having solder attachment pads 34 (shown in dashed lines) underlying the conductors 32. Adhesive control grid elements 36 are provided and are formed together with the conductors 32. The conductors 32 are formed from 0.005 inches (0.127 mm) copper layers and the spacing 38 between the conductors 32 may be as small as 0.002 inches (0.051 mm) or less depending on the thickness of a dielectric layer 40 which supports the copper layers during construction of the FSCN.

Figure 4:
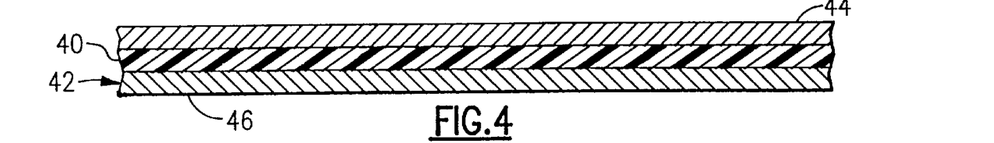
FIGS. 4–9 diagrammatically illustrate method steps involved in the production of a circuit pattern in accordance with the second embodiment.
Figure 5:
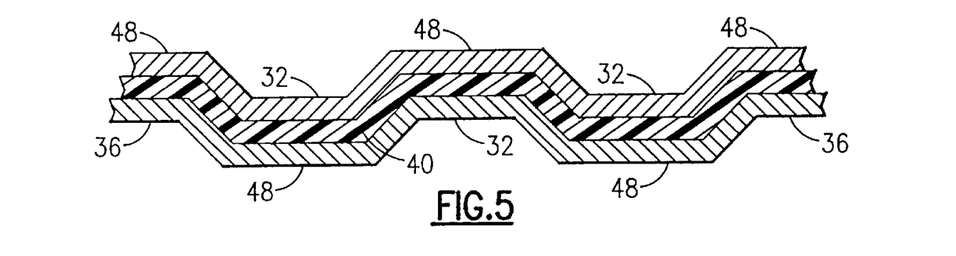
Figure 6:
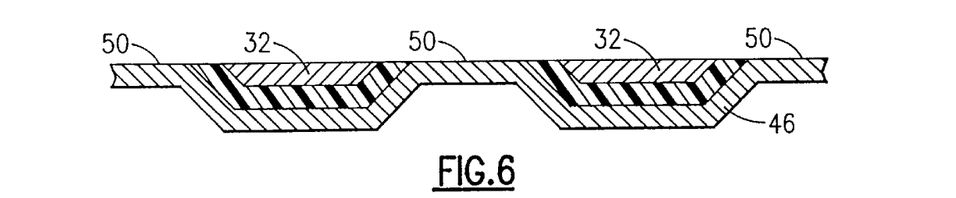

The FSCN is formed from a laminate 42 comprising a dielectric layer 40, 0.002 inches (0.05 mm) thick, having first 44 and second 46 layers of copper, each 0.005 inches (0.13 mm) thick disposed on opposite faces thereof (FIG. 4). This laminate 42 is formed by, for example, coining, stamping or rolling, into a non-planar pattern (FIG. 5) defining areas of waste material 48, conductors 32 and a control grid 36. Waste material 48 is now mechanically machined, for example, by diamond fly cutting or wire EDM, from the first copper layer 44 to produce a cross-section of laminate (FIG. 6) in which alternate conductors 32 have been formed and portions of the dielectric layer 40 are removed to expose portions 50 of the second copper layer 46.

Figure 7:
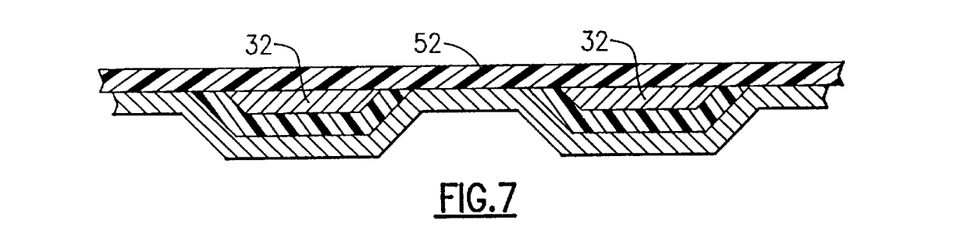
Figure 8:
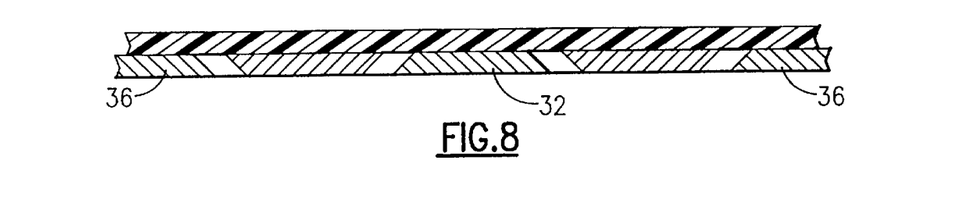

A dielectric layer 52 is then made fast, in a void free manner, with the already formed conductors 32, the exposed portions 50 and the dielectric material 40 thereafter (FIG. 7). The dielectric layer 52 may be an adhesive which is cured in place or a layer of, for example, a polyimide such as Kapton which attached to the laminate 42 by a dielectric adhesive.

The second copper layer 46 is then machined in similar manner to the first copper layer 44 to remove the remaining waste material 48 and unwanted portions of the dielectric layer 40 to form the remaining conductor 32 (FIG. 8) and control grid 36, to expose all of the conductors 32 and control grid 36 with these elements spaced apart, by the remainder of the dielectric layer 40, by approximately the thickness of that layer 40, namely 0.002 inches (0.05 mm).

Figure 9:
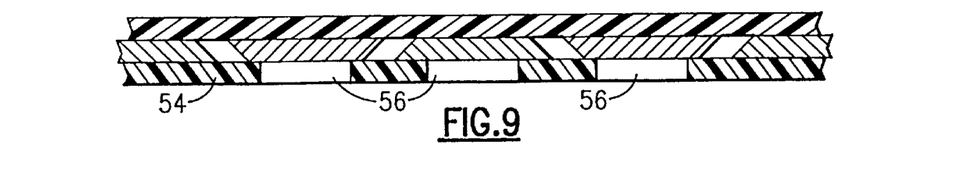

Optionally (FIG. 9) a pre-punched dielectric layer 54, with openings 56 to facilitate attachment of components or conductors to the pads 34, may be made fast with the exposed conductors.

The dielectric materials used in this method may be, for example, Kapton or Teflon.

Thus in the method described with reference to FIGS. 3 to 8 adjacent conductors, of any desired width, are produced alternately from the first and second copper layers 44,46 and are spaced by a dimension determined by the thickness of the intermediate dielectric layer 40.

Figure 10:
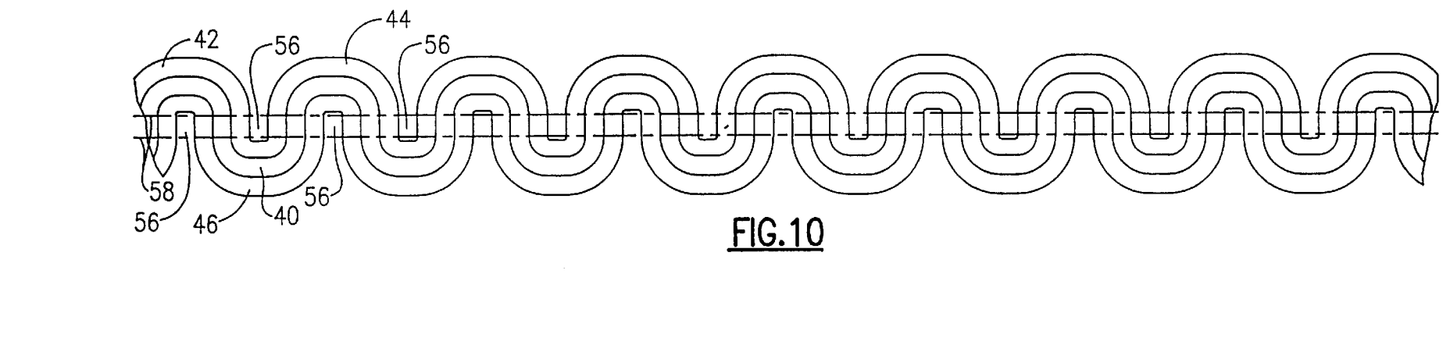
FIGS. 10 and 11 illustrate a variation of the second embodiment of the invention in which a circuit pattern having very narrow conductors spaced by very narrow areas of dielectric is produced.
Figure 11:
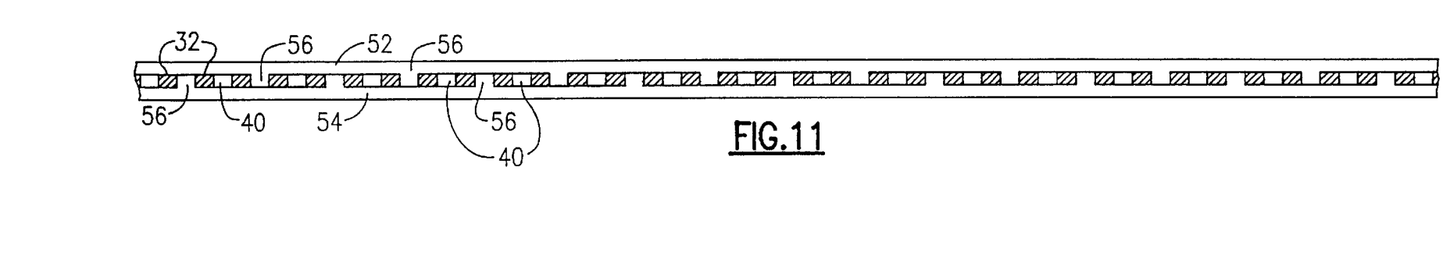

In a variation of the last above described method (FIGS. 10 and 11) the laminate 42 comprises an intermediate dielectric layer 40, 0.001 inches (0.025 mm) thick to opposed faces of which a copper foil 44, 46 is made fast by means of 0.0002 inches (0.005 mm) thick dielectric adhesive. The copper foil is 0.0014 inches (0.04 mm) thick. The laminate is formed and machined in similar manner to the method described with reference to FIGS. 3 to 8 to produce a circuit pattern (FIG. 11) having conductors 32, 0.0014 inches (0.04 mm) wide spaced apart 0.0014 inches (0.04 mm) by dielectric material. Here the dielectric layer 54 may or may not be pre-punched. It will be appreciated that in this variation the forming of the laminate to produce a non-planar pattern and the machining steps are performed so that not only does the thickness of the dielectric layer 40 determine the conductor spacing but also the conductor width and conductor spacing 56 are determined by the copper foil thickness and the spacing 56 between the formed copper foil surfaces between cut lines 58 (FIG. 10), the copper foil thickness between the cut lines 58 extending substantially parallel to these cut lines.

Figure 12:
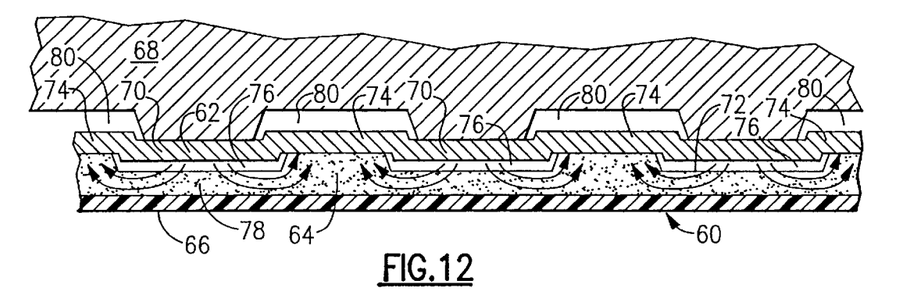
FIGS. 12, 13 and 14 diagrammatically illustrate steps in a method in according to a third embodiment of the present invention in which a heated template (die) is used to produce a non-planar circuit pattern with an adhesive liquefication facilitating the production of a conductor circuit pattern.
Figure 13:
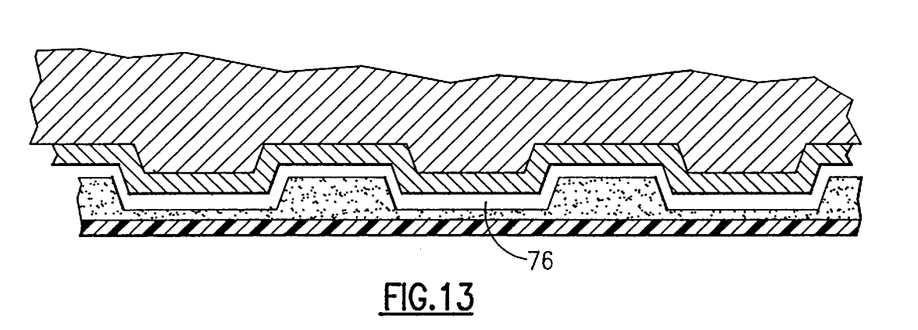
Figure 14:
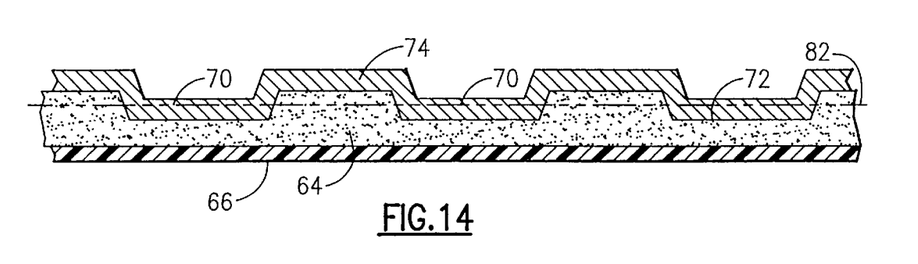

A method of forming a copper foil into a non-planar pattern defining conductors, waste material and control grid features will now be described with reference to FIGS. 12 to 14.

This process teaches how to form a conventional laminate 60 (e.g. copper 62, adhesive 64, dielectric 66) by sequentially modifying the flow characteristics of the adhesive (thermoplastic or partially cured thermoset). This is accomplished by transferring heat and pressure through a forming template 68 (die), to the copper, as it is being formed. An important feature of this process is that the heated template is designed to transfer the correct forming temperature, to the copper, in only those areas of the circuit (conductors 70, control grid 72, etc.) that will remain after waste material removal. The waste material (spaces between conductors and control grid) on the laminate always remains 10° to 30° cooler than the circuit pattern. This is because the template is spaced from the waste material of the foil during formation of the copper into a non-planar, circuit pattern until that formation is substantially complete. This approach allows the appropriate amount of heat to be directed to the conductive material, as is required to displace the adhesive, directly under the conductor pattern to force it into the adhesive. During the forming process the waste material 74 is supported by primarily solid adhesive (not directly in contact with a heated template) and malleable adhesive together with some liquid adhesive that is being displaced during the forming process.

Directional displacement of the adhesive is accomplished by creating a "Liquid Displacement Zone" (LDZ) at the interface of the copper and adhesive. The LDZ radiates 0.0001 inches (0.0025 mm) to 0.0005 inches (0.0127 mm) into the adhesive 64 and causes it to liquify and act as a forming lubricant. By i s varying the temperature of the copper/adhesive, an adhesive transition zone is created. This zone will transition from a liquid 76, at the copper 62 interface, to a solid 78, at the interface of the dielectric 66.

The heated template is maintained at the temperature required to support the LDZ under and around the conductors, during the forming process, The adhesive in the waste area remains substantially solid as it is not directly subjected to the pressure and heat of the forming die. For that reason, it will support the unwanted (waste) copper 74.

Forming conductive material by selectively directing heat into carefully controlled "Melt Zones" is designed to achieve the desired adhesive displacement, while maintaining the dielectric as a flat reference surface.

The process takes advantage of the adhesives Temperature Transition Curve (TTC), which occurs when a material moves from a malleable to a melt temperature. Once the TTC is known, the correct heat is selectively transferred to and pressure applied to the copper in only those areas to be formed into the adhesive or dielectric layer. The conductive material that is in direct contact with the die is heated to either a melt or transition temperature that will displace the adhesive as the copper (conductor or adhesive control grid) is forced into it. During the forming process, the unformed copper (waste material) is supported by both the adhesive that has not been liquified and the malleable adhesive and some liquid adhesive that is being displaced during the forming process.

As an example, to form a conductor pattern into a typical polyester adhesive would require a forming temperature of 350° F. (177° C.) while the supporting space between the conductors is not exceed 335° F. (168° C.). To keep the supporting structure cool one may:

a) Control Speed of Forming . . . this approach simulates a hot knife passing through butter, it completes the forming operation before the copper is heated evenly throughout;

b) Blow cool air through space between the conductors during forming;

c) Place an insulating barrier in the space between the conductors; This technique establish, maintain and/or improve the LDZ and allow the transition from a liquid, at the copper interface, to a solid, at the interface of the dielectric during the forming process.

d) Design the depth of the waste troughs 80 in the template 68 to provide maximum insulation between heating elements, to accommodate expanding waste material and to ensure the formed structure remains flat; or e) Any suitable combination of a), b), c) and d).

The heated template is maintained at the temperature required to support the LDZ only under and around the formed conductors, during the forming process.

In this method the laminate, supported by a chilled support platen in contact with a dielectric layer 66, is contacted by the conductor 70 and control grid 72 forming features of a template 68 maintained at a temperature of 350° F. (177° C.) for a polyester adhesive 64 by which a copper foil 62 is attached to the dielectric layer 66 of polyimide (e.g. Kapton) forming laminate 60 (FIG. 12). The adhesive is heated in the contact areas and achieves a liquid state thereby allowing the conductors 70 and control grid 72 to be pressed into the liquid adhesive 76 and underlying malleable adhesive while the liquid adhesive is forced from under the conductors 70 and control grid as shown by the flow arrows in FIG. 12. During this forming stage, the operation is controlled to maintain the adhesive 64 at a temperature not exceeding 335° C. (168° C.) in order that the copper foil 62 under waste areas 74 is supported at a desired level. The chilled support platen controls the temperature of the layer 66 to assist in ensuring that the adhesive adjacent the dielectric layer 66 remains solid.

As the heated template 13 is pressed to deform the copper foil, the liquid adhesive will eventually form a layer throughout the extent of the copper foil (FIG. 13) as the forming process is completed and the template 68 is then removed leaving a formed circuit pattern (FIG. 14) which cools or is cooled to solidify the adhesive. The adhesive is then cured if such curing is needed. The waste copper 74 is then removed down to cut line 82 to form the desired circuit pattern of conductors 70 and control grid 72 attached to dielectric layer 66 by the adhesive.

This manufacturing process teaches the use of a metal template (die) designed to form a planar electrically conductive sheet into a non-planar pattern while maintaining the desired structural shape, dimensional stability, and a flat reference surface. This reference surface is important as it controls the waste removal process. The process controls the location of each conductor within a circuit pattern and across a cluster of individual circuits to within 0.0002 inches (0.005 mm), or less, of a fixed reference surface. This dimensional control is held across a 12 inches (304 mm) wide (minimum) roll of material, typically 250 inches (6.350 meters) long, and is vital to developing a commercially viable process. The flatness of the reference surface and its location to the formed conductors is critical to accomplish the precision machining necessary to remove waste material to within 0.0001 inches (0.0025 mm) and achieve the desired conductor thickness.

The present process provides:

1) The ability to displace, not compress, adhesive or dielectric when forming a planar electrically conductive sheet into a non-planar pattern;
2) The ability to selectively accommodate expanding waste material to ensure the formed structure remains flat. This makes it possible to commercialize this technique;
3) The ability to form a thin (0.0007 inch (0.018 mm) thick) sheet of conductive material into a non-planar pattern and in so doing, stabilize, support and entrap the conductors in adhesive to prevent their movement or delamination, as the waste material is mechanically removed. This is accomplished using a tapered forming template or die. The use of a die having tapered side walls increases the tensile elongation potential of the copper as it is formed around a stable adhesive or dielectric structure as will be described hereinafter.

For the die/template to perform its desired function it may include one or more of the following features:

i) Using heat or formula modifications we condition the adhesive and/or dielectric to receive, capture and support a formed conductor pattern. This conditioning process the adhesive and/or dielectric to be used to eliminate half of a die set, by controlling the adhesives viscosity such that it supports the waste material, and eliminating adhesive compression stress;
ii) Using a control grid built into the metal forming template and designed to selectively capture and direct the flow of conditioned adhesive and/or dielectric. The primary purpose of the control grid is to create a hydraulic flow of conditioned adhesive that will lift and support the waste material.
(iii) A material conditioning process is used to condition an adhesive and/or dielectric to receive, capture and support a formed conductor pattern to:
1) Eliminate compression stress by conditioning the adhesive and/or dielectric to flow out from under the formed conductor;
2) Quick chill a laminate as it is being formed to set-up and stabilize the adhesive and/or dielectric;
3) Heat treat the conductive material to re-establish the desired metal temper; and
4) Use the heat treating process and residual (stored) heat to fuse a dielectric to the formed metal.

A method of forming a copper foil into a non-planar pattern with tapered walled (trapezoidal cross-section) ridges and troughs will now be described with reference to FIGS. 15 to 17.

Figures 15, 16:
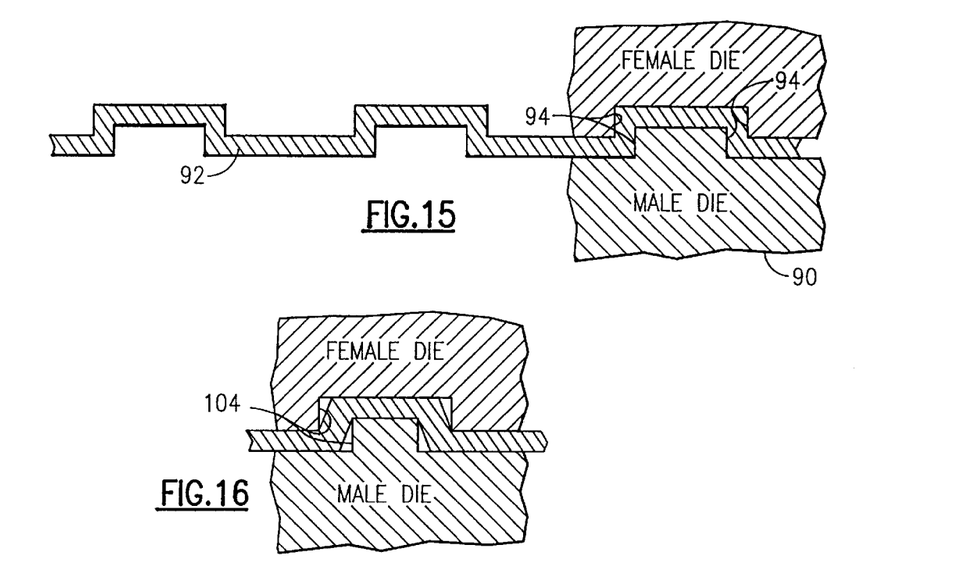
FIGS. 15 and 16 illustrate conventional die set arrangements for deforming a metal foil into a non-planar circuit pattern.

FIG. 15 illustrates a conventional die set 90 having mating male and female parts which cooperate to form a copper foil 92 into a non-planar pattern. The die 90 defining the non-planar shape uses vertical walls 94 which forces the copper foil to be stretched in a narrow elongation zone formed between the vertical walls of the male and female parts as they are brought together. This tends to shear and/or tear the copper foil as it is formed into the non-planar shape.

In FIG. 16 the tapered side walls are provided by spacing vertical sidewall forming surfaces 104 farther apart than the thickness of the copper foil being formed thereby to allow the foil to stretch within the forming space between the male and female die parts as they are brought together. The foil here is subject to bi-axial stretching which causes high stress areas to form in the foil at the edges of the die parts. Tearing of the foil can easily occur in this arrangement.

Figures 17, 18, 19:
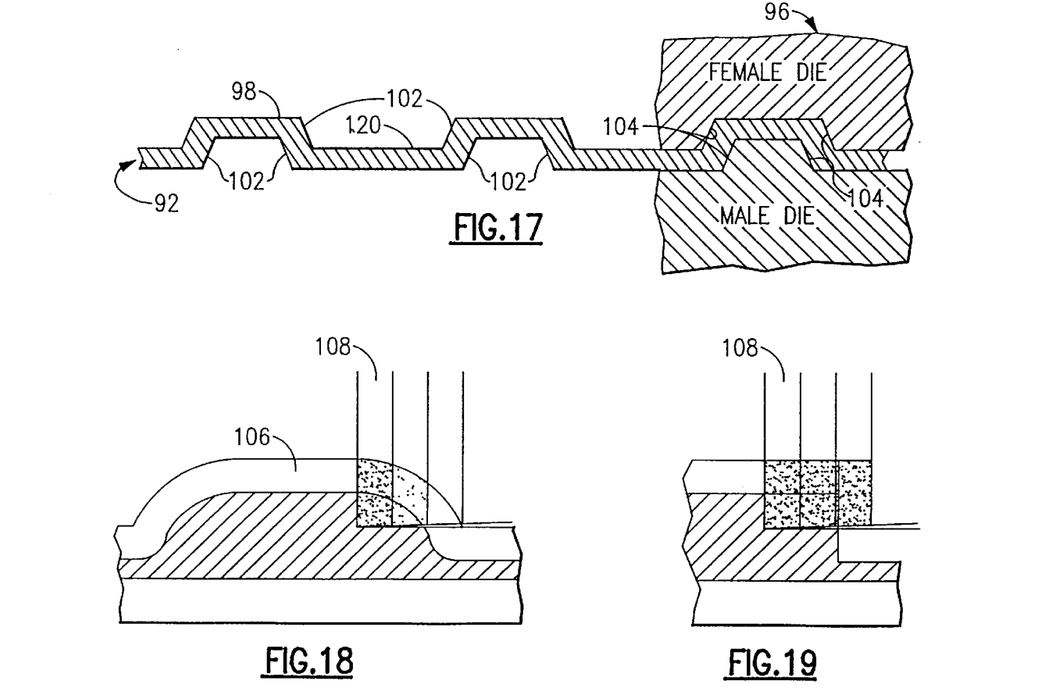
FIG. 17 illustrates a die set designed to overcome problems of the conventional die sets illustrates in FIGS. 15 and 16.
FIGS. 18 and 19 illustrate advantages derived from the die set illustrated in FIG. 17 when waste material in the foil is removed by a diamond fly cutter.

These problems can be overcome and other advantages provided by the die set 96 illustrated in FIG. 17. This die set overcomes the problems of the conventional die sets of FIGS. 15 and 16 by design features of the mating male and female parts designed to produce a non-planar circuit pattern with ridges 98 and troughs 100 having tapered sidewalls 102 providing a trapezoidal cross-section.

The die set 96 of FIG. 17 has male and female die parts with tapered sidewalls 104 defining the sidewall forming elements of the die set 96 as it forms the ridges 98 and troughs 100 in copper foil 92.

Using a tapered die set 96 increases the tensile elongation potential of the material, by gradually forming the copper around a supported structure. In addition, this technique takes maximum advantage of the material's natural plastic flow characteristics by extruding the structures side walls between the male and female die. The most common failure of a forming operation is rupturing of the metal in a critical area because of insufficient strength to withstand the force required to draw the metal into the die. The approach of FIG. 17 minimizes tearing and greatly increases forming density. This approach also permits deep forming of the copper foil to increase the height differential between the tops of ridges 90 and bottom of troughs 100 as compared with conventional die sets as is shown in FIGS. 15 and 16.

The provision of tapered side walls (trapezoidal circuit feature cross-sections, facilitates removal of the formed metal from the die when there is a textured finish as compared with the straight sides of the die of, for example, FIG. 15.

The provision of tapered side walls also facilitates removal of waste material from the circuit pattern formed by the non-planar pattern formed by die set 96 once that foil has been attached to a dielectric layer. This is particularly so when diamond fly cutting is used for the mechanical removal of the waste material 106 (FIG. 18) as the diamond teeth 108 of the cutter initially encounter a tapered surface thereby reducing impact stresses and vibration in the teeth, thereby enhancing useful diamond life, as compared with a vertical side wall non-planar circuit pattern (FIG. 19) in which the diamond teeth 108 initially impact a vertical wall of waste material with the attendant high impact stresses and undesirable vibration which can be destructive of the teeth.

Another feature of the effective commercialization of the formation of FSCN according to the present invention, is a adjusting forming depth by expanding or contracting a copper foil forming tool. This process uses an external or internal heating source to establish two or more heating zones across the forming tool and selectively adjusting the temperature of each zone to increase or decrease the forming tool in each zone. In the case of a forming roll, this allows changes in the tools diameter and in so doing its forming depth. Using this technique micro adjustment of the roll by 0.0001 inches (0.0025 mm) to 0.001 inches (0.025 mm) as required to fine tune the forming processes is possible. In those applications requiring large amounts of forming adjustment, shim stock may be positioned between the forming roll and the template to increase range of adjustment.

In the case of vacuum formation of copper foil into a non-planar circuit pattern, a laminate of copper and dielectric material is partially formed into the non-planar pattern and, while maintaining a vacuum against the dielectric material, an amount (approximately 50%) of the raised portions (waste area) of the copper is removed from a exposed side of said metallic sheet, thereby to sufficiently weaken the formed structure to allow the vacuum to draw the circuit pattern below a desired cutting line. Then, while maintaining the vacuum, against the dielectric material, making a second metal removal pass, over the first, to remove the remaining portion of said copper, to form electrically isolated conductive paths.

It is noted from the foregoing that the process of this invention allows the production of fine-line flexible conductive networks (for example, circuits and jumpers) and conventional, high volume, printed circuit boards at relatively low cost through an environmentally desirable process.

As will be appreciated, the process of the present invention is very versatile and permits the creation of a conductive pattern in one or more of the various embodiments herein described.

The present invention also permits the production of sculptured (3 dimensional) circuit networks in which portions of the network are thicker than others thereby to provide, for example, rigid contact areas with flexible interconnects. This is accomplished by creating the appropriate three dimensional forming die which includes the desired features utilizing a conductive material or composite material laminate, which is then formed as hereinbefore described.

Conductor networks and/or their terminating points, in accordance with the present invention, may be plated with any surface finish because the present invention has the ability to manufacture conductor networks from a sheet or roll of conductive material on which a suitable contact finish (for example, gold) has been previously placed or inlaid. This approach is only practical with the process of the present invention as the process mechanically defines each conductor by grinding off unwanted waste material between each conductor thereby easily removing any unwanted gold. This contrasts sharply with conventional etching systems used to create printed circuit boards as conventional etching solutions will not remove gold and therefore would require additional processing steps. Consequently, the present invention significantly reduces both costs of applying and selectively removing the desired contact finish.

The final conductive paths and their terminating points can be designed to any specific electrical parameter (for example, power and signal) or configuration. For example, the controlled impedance of each conductive path can be selected to suit a particular application by appropriately controlling its configuration and/or its relationship to an electrically conductive support structure (for example, a spring layer or shield) if any. It is important to note that although conductors and/or their terminating points can be plated with any surface finish, if a conductor pattern is not electrically connected to a common plating bus, the gold, by example, must be plated on before the conductive paths are electrically isolated.

Further, depending on the use of the conductive network, the conductive paths can be insulated with a pre-windowed protective overlay or solder mask. Suitable insulating materials include but are not limited to, Kapton, Mylar and Teflon. This protective overlay provides a means to construct multi-layer conductive networks (for example, multi-layer circuit boards) or to add shielding material to the conductive network.

In embodiments in which the dielectric material is adhesively attached to the copper, the circuit pattern may be formed in the copper layer with the dielectric material undeformed. Here the adhesive is displaced to allow the pattern formation and to fill the voids otherwise produced. The conductive network can be insulated with a protective overlay, if required, and may be used to produce multi-layer circuit boards overlaying one another with appropriate protective intermediate dielectric material insulating the boards except where contact is desired through openings or windows.

Pressure fused interconnections can be easily created to join two conductive sheets, one of which has stress hardened domes located at the points to be interconnected, using high pressure rollers. This is accomplished with the two sheets of conductive networks registered to each side of a pre-punched windowed flexible dielectric layer. The flexible dielectric material, for example, 0.05 mm (0.002 inches) thick, may be polyester. The stress hardened domes produce pressure fused interconnections as they pass through the high pressure rollers. In additional each interconnect is structurally reinforced by the laminating process.

Figure 20:
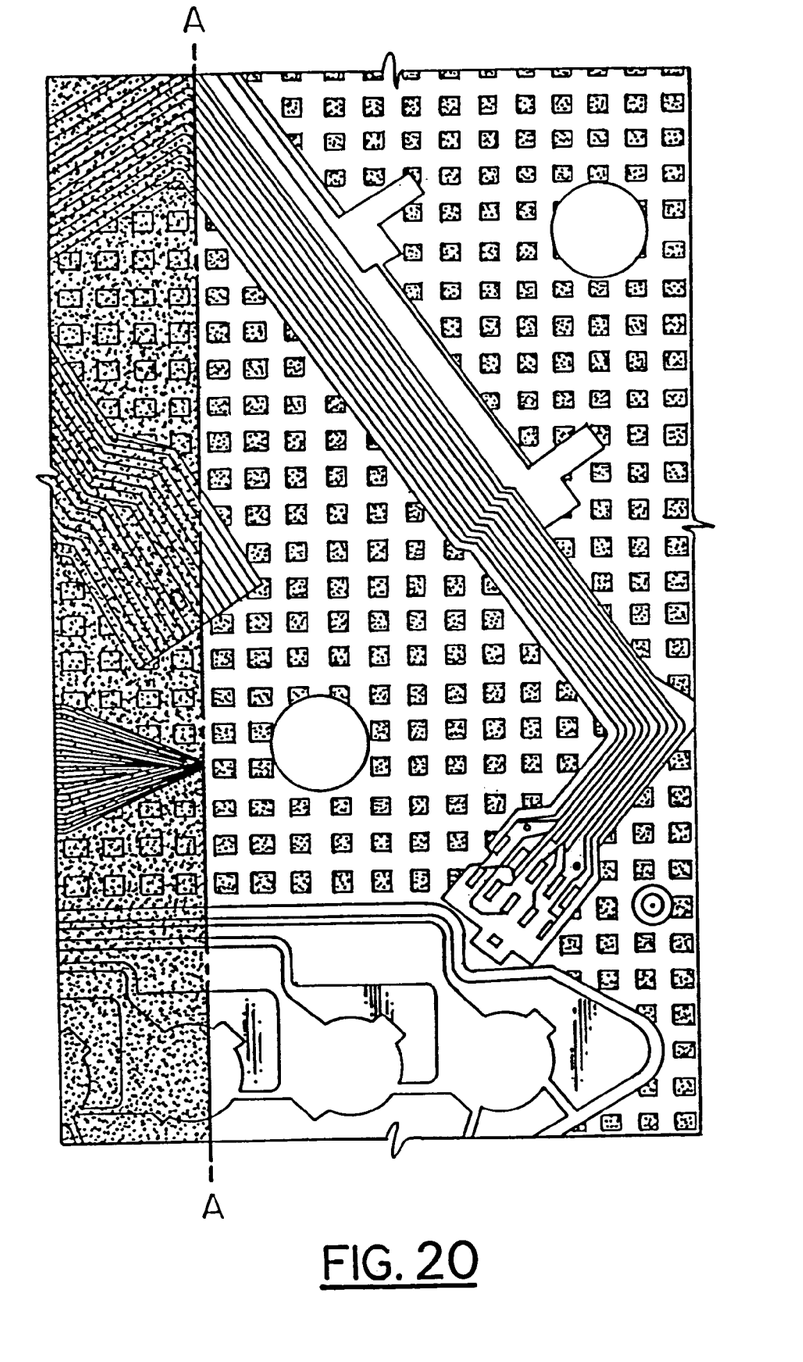
FIG. 20 illustrates a portion of a circuit which may be produced in accordance with the present invention showing various features of the circuit.

An example of a circuit with features formed by a die having a control grid according to the invention is shown in FIG. 20 in which the waste material has been removed from the laminate on the right side of line A—A, but not on the left side of line A—A. Control grid features in FIG. 20 partially remain after machining and can be seen as rows of small squares located in the areas between the circuit paths.

The control grid must be designed to control the flow of the adhesive or the dielectric substrate during forming such that the conductive material is deformed into two, three or more levels, i.e. the waste material level, and various circuit levels, in planar configurations. The control grid must also control the flow of the adhesive or dielectric so that the various levels are supported on three sides by the adhesive or dielectric without any voids being created. All of this must be done while maintaining a flat reference surface in strict dimensional relation with the various material levels.

The control grid and expansion troughs must also control the flow of the adhesive or dielectric such that the adhesive or dielectric is displaced and not compressed. The expansion troughs allow the adhesive or dielectric to be displaced upwards into the die relieving any compression stresses that would distort the formed structure. Thus the supported surface of laminate remains flush against the support platen 17 providing a stable, flat reference plane, which the known methods are unable to produce.

When the forming die is a cylindrical forming roll and the conductor is formed by feeding the conductor between the forming roll and a support surface, the control grid helps keep the dielectric or adhesive from flowing to either side, relative to the direction of travel of the conductor. The control grid thus helps ensure that the flow of adhesive or dielectric is uniform across the width of the conductor as it is fed between the forming roll and the support surface, thereby providing transverse dimensional uniformity in the formed nonplanar pattern.

The design of the control grid is dependent on the geometry of the final circuit to be formed, the thickness of the adhesive or dielectric layer and the volume of the adhesive or dielectric to be displaced during forming. The volume of adhesive or dielectric to be displaced is calculated from the length, width, thickness and spacing of the conductors to be formed. From this information, the width, length, thickness and location of the forming die's displacing features, including displacement grid, and/or expansion troughs can be determined.

Because each circuit configuration is different, there is no set formula for designing the forming die. Each forming die must be designed to achieve the desired result based on the material characteristics and configuration of the circuit to be formed.

What is claimed is:

1. A method of forming an electrically conductive laminate into a non-planar pattern defining spaced electrically conductive paths of any desired width comprising the steps of:

(a) providing a laminate (42) having a first dielectric layer (40) with first and second conductive layers (44, 46), disposed on opposite faces of said first dielectric layer;

(b) forming said laminate into a non-planar pattern having a first side and a second side opposite said first side, wherein said non-planar pattern defines areas of a waste material (48), first conductors (32), first dielectric (40) and second conductors (36);

(c) machining said first side of said non-planar pattern to remove said waste material from said first conductive layer, to form a first face of said laminate to expose alternating said first and second conductors (36) spaced by said first dielectric layer (40);

(d) attaching a second dielectric layer (52) to said first face; and (e) machining said second side of said non-planar pattern to remove waste portions of said second conductive layer and of said first dielectric layer to form a second face of said laminate exposing said first and second conductors, spaced by said first dielectric layer (40).

2. The method of claim 1, comprising the subsequent step of:

f) attaching a third dielectric layer (54) to said second face.

3. The method of claim 2, comprising the step of:

pre-punching openings in said third dielectric layer.

4. The method of claim 1, comprising the step of:

machining said non-planar pattern by the use of diamond fly cutting.

5. The method of claim 2 comprising, during the forming step, forming the laminate into a serpentine shape bisected by two parallel spaced planar cut lines (58), with said waste material comprising first and second areas of waste material spaced apart by the cut lines (58); portions of the conductive layers (44, 46), lying between and parallel to said cut lines (58), alternating to form said spaced electrically conductive paths spaced, alternately, by the first dielectric (40) and spaces (56);

the machining of the first side removes said waste material adjacent to a first of the cut lines (58);

the dielectric layer (52) fills alternate said spaces (56);

the machining of the second side removes said waste material adjacent to the other of the cut lines (58); and the third dielectric layer (54) fills remaining said spaces (56).

6. The method in claim 5, comprising the steps of pre-punching openings in said third dielectric layer.

7. A method of forming a conductive metallic laminae, into a non-planar pattern defining spaced electrically conductive paths at a first level and unwanted waste conductive material at second and third levels one on either side of the first level, the laminae having a first and a second electrically conductive lamina fast with and spaced by a dielectric substrate, comprising the steps of:

a) forming the laminae into the non-planar pattern with the electrically conductive paths lying in a plane defined by the first level and alternately composed of the first and second electrically conductive lamina;

b) machining to remove the unwanted waste conductive material at the second level to expose the electrically conductive paths of both the first and second electrically conductive lamina spaced apart by the dielectric substrate;

c) applying a layer of dielectric material to cover and support the thereby exposed electrically conductive paths and dielectric substrate therebetween, and;

d) machining to remove the unwanted waste conductive material at the third level to again expose the electrically conductive paths of both lamina spaced apart by the dielectric substrate and supported by the layer of dielectric material.

\* \* \* \* \*